United States Patent [19]
Arnett et al.

[11] Patent Number: 5,849,641
[45] Date of Patent: Dec. 15, 1998

[54] METHODS AND APPARATUS FOR ETCHING A CONDUCTIVE LAYER TO IMPROVE YIELD

[75] Inventors: David R. Arnett, Fremont, Calif.; Jeffrey V. Musser, Boise, Id.

[73] Assignee: Lam Research Corporation, Fremont, Calif.

[21] Appl. No.: 820,533

[22] Filed: Mar. 19, 1997

[51] Int. Cl.$^6$ .................................................. H01L 21/00
[52] U.S. Cl. ......................... 438/734; 438/713; 438/714; 438/720; 438/742; 216/67; 257/775
[58] Field of Search ........................ 156/345 P; 438/713, 438/719, 720, 734, 742, 714; 257/763, 773, 775, 770, 774; 216/67, 75, 77

[56] References Cited

U.S. PATENT DOCUMENTS

| | | | |
|---|---|---|---|
| 3,994,793 | 11/1976 | Harvilchuck et al. | 204/192 |
| 4,350,563 | 9/1982 | Takada et al. | 156/643 |
| 4,370,196 | 1/1983 | Vossen, Jr. et al. | 156/643 |
| 4,373,990 | 2/1983 | Porter | 156/643 |
| 4,798,650 | 1/1989 | Nakamura et al. | 438/713 X |
| 4,838,992 | 6/1989 | Abraham | 438/734 X |
| 5,126,008 | 6/1992 | Levy | 156/665 |
| 5,185,058 | 2/1993 | Cathey, Jr. | 156/656 |
| 5,207,868 | 5/1993 | Shinohara | 156/656 |
| 5,211,804 | 5/1993 | Kobayashi | 156/665 |
| 5,387,556 | 2/1995 | Xiaobing et al. | 437/228 |
| 5,530,488 | 6/1996 | Webb | 156/643 |
| 5,688,723 | 11/1997 | Okamoto et al. | 438/734 X |

FOREIGN PATENT DOCUMENTS

| | | |
|---|---|---|
| 076 860 A1 | 4/1983 | European Pat. Off. . |
| 0 301 335 A2 | 1/1989 | European Pat. Off. . |
| 427 327 A1 | 5/1991 | European Pat. Off. . |
| 502 523 A2 | 9/1992 | European Pat. Off. . |
| 535 540 A2 | 4/1993 | European Pat. Off. . |
| 622 477 | 11/1994 | European Pat. Off. . |
| 622 477 A1 | 11/1994 | European Pat. Off. . |
| 702 391 | 3/1996 | European Pat. Off. . |
| 702 391 A1 | 3/1996 | European Pat. Off. . |
| 2 312 114 | 12/1976 | France . |
| 39 40 083 A1 | 6/1991 | Germany . |
| 41 05 103 A1 | 8/1991 | Germany . |

OTHER PUBLICATIONS

R.S. Bennet et al., "Process for Reactive Ion Etching of Polycide," IBM Disclosure Bulletin, vol. 24, No. 9, Feb. 1982, New York, p. 4486.

Unknown, "*Patent Abstracts of Japan*", vol.018, No. 477 (E–1602), & JP 06 163538A, Sumitomo Metal Ind Ltd., Oct. 6, 1994 (Publication date).

Unknown, "*Patent Abstracts of Japan*", vol. 018, No. 392 (C–1228), & JP 06 108272A, Sumitomo Metal Ind. Ltd., 19, Apr. 1994 (Publication date).

R.A. Gottscho, C.W. Jurgensen, and D.J. Vitkavage, "Microscopic Uniformity in Plasma Etching," J. Vac. Sci. Technol. B 10(5), pp. 2133–2147 (1992).

T. Sato, N. Fujiwara, and M. Yoneda, "Mechanism of Reactive Ion Etching Lag for Aluminumm Alloy Etching," Jpn. J. Appl. Phys. 34 (Pt. 1 No. 4B), pp. 2142–2146 (1995).

(List continued on next page.)

*Primary Examiner*—William Powell
*Attorney, Agent, or Firm*—Beyer & Weaver, LLP

[57] ABSTRACT

A method in a substrate processing chamber for forming a conductive feature by etching through a conductive layer disposed above a semiconductor substrate. The method includes etching at least partially through the conductive layer using a first etch recipe to form a top portion of the conductive feature. The method further includes thereafter etching at least partially through a remaining thickness of the conductive layer using a second etch recipe different from the first etch recipe to form a bottom portion of the conductive feature. The bottom portion is disposed below the top portion. The second etch recipe is configured to yield a sloped etch foot in the bottom portion of the conductive feature.

25 Claims, 7 Drawing Sheets

OTHER PUBLICATIONS

Y. Kusumi, N. Fujiwara, J. Matsumoto, and M. Yoneda, "Effect of $N_2$ Addition on Aluminum Alloy Etching by Electron Cyclotron Resonnance Reactive Ion Etching and Magnetically Enhanced Reactive Ion Etching," Jpn. J. Appl. Phys. 34 (Pt. No. 4B), 2147–2151 (1995).

N. Fujiwara, J. Sawai, M. Yoneda, K. Nishioka, and H. Abe, "ECR Plasma Etching with Heavy Halogen Ions," Jpn. J. Appl. Phys. 29 (No. 10), 2223–2228 (1995).

P.E. Riley, S.S. Peng, anf l.Fang, "Plasma Etching of Aluminum for ULSI Circuits," Solid State Technology, pp. 47–55, Feb. 1993.

H.C. Jones, R. Bennett, and J. Singh, "Size Dependant Etching of Small Shapes," Proc. 8th Plasma Symp., ECS vol. 90–2, pp. 45–58 (1990).

N. Kofuji, K. Tsujimoto, T. Kumihashi, and S. Tachi, "Reduction in Microloading by High–Gas–Flow–Rate Electron Cyclotron Resonance Plasma Etching," Jpn. J. Appl. Phys. 34 (Pt. 1 No. 5A), pp. 2489–2494 (1995).

METHODS AND APPARATUS FOR ETCHING A CONDUCTIVE LAYER TO IMPROVE YIELD

BACKGROUND OF THE INVENTION

The present invention relates to the fabrication of semiconductor devices. More particularly, the present invention relates to methods and apparatus for etching through the conductive layer of a layer stack during the fabrication of semiconductor devices.

In the fabrication of semiconductor devices, e.g., semiconductor integrated circuits (ICs) or flat panel displays, devices such as component transistors are typically formed on a substrate, e.g., a silicon wafer or a glass panel. Conductive interconnect lines, which may be for example metal lines etched from a metallization layer disposed above the substrate, are then employed to couple the devices together to form the desired circuit. The metallization layer may comprise, for example, aluminum or one of its alloys, which may include copper or silicon.

For some circuits, multiple conductive layers may be necessary to fulfill the interconnect requirements. These conductive layers are typically separated from each other by an insulating layer, e.g., an interlayer oxide. If an electrical connection is desired between two conductive features or lines in two different conductive layers, a conductive plug may be employed to provide an electrical path between the two conductive features through the intermediate insulating dielectric layer.

To facilitate discussion, FIG. 1 illustrates a cross-sectional view of a layer stack 10, representing the layers that may be formed during the fabrication of a typical semiconductor device. In FIG. 1 as well as the figures herein, it should be noted that the layers shown therein are illustrative only; other additional layers above, below, or between the layers shown may be present. Further, not all of the shown layers need necessarily be present and some or all may be substituted by other different layers using knowledge commonly possessed by those skilled in the art.

At the bottom of layer stack 10, there is shown a substrate 100 representing for example a silicon wafer or a glass panel. A first conductive layer 102 is formed above substrate 100. After conductive layer 102 is patterned as desired (using for example a conventional photoresist process) an insulating layer 104, comprising for example $SiO_2$, may then be formed above conductive layer 102.

A via 112 is formed within insulating layer 104 using for example a conventional etching process. Within via 112, a conductive plug 114 is formed to permit selected conductive features in conductive layer 102 and subsequently deposited conductive layer 106 to make an electrical connection. As is well known to those skilled in the art, conductive plug 114 may comprise tungsten or one of its alloys. When tungsten is employed as a conductive plug material, an adhesion layer 116 (in the form of an annular ring lining the interior of via 112 in the example of FIG. 1) is often employed to allow conductive plug 114 to more securely adhere to the walls of via 112 in insulating layer 104 throughout the fabrication process and during use.

A conductive layer 106 may then be formed above insulating layer 104. Conductive layer 106 may include a barrier layer 108, typically comprising Ti, TiW, TiN or any other suitable barrier materials. Barrier layer 108, which is optional, may be disposed between insulating layer 104 and a subsequently deposited interconnect layer 110. Barrier layer 108, when provided, functions to prevent the diffusion of silicon atoms from insulating layer 104 into interconnect layer 110 Likewise, another barrier layer may also be provided between conductive layer 102 and insulating layer 104. Interconnect layer 110 typically comprises copper, aluminum or one of the known aluminum alloys such as Al—Cu, Al—Si, or Al—Cu—Si.

Adhesion layer 116 within via 112 may comprise the same or similar material as that employed in barrier layer 108, e.g., Ti, TiW, TIN, or other similarly suitable adhesion materials. The layers and features of layer stack 10 are readily recognizable to those skilled in the art and may be formed using any of a number of suitable and known deposition and etching processes, including chemical vapor deposition (CVD), plasma-enhanced chemical vapor deposition (PECVD), physical vapor deposition (PVD) such as sputtering, wet etching, and/or plasma-enhanced etching.

To etch the desired pattern of lines in conductive layer 106, an overlaying photoresist (PR) layer 118 is then formed atop the blanket-deposited conductive layer 106. Photoresist layer 118 may then be patterned (e.g., through a conventional photoresist technique) to facilitate etching of the underlaying conductive layer 106. By way of example, one such photoresist technique involves the patterning of photoresist layer 118 by exposing the photoresist material in a contact or stepper lithography system, and the development of the photoresist material to form a mask to facilitate subsequent etching. Using an appropriate etchant, the areas of the conductive layer that are unprotected by the mask are then etched away, leaving behind conductive interconnect lines or features.

To achieve greater circuit density, modern semiconductor devices are scaled with increasingly narrower design rules. As a result, the feature sizes, i.e., the width of the conductive interconnect features or the spacings (e.g., trenches) between adjacent conductive features, have steadily decreased. By way of example, while a Line width of approximately 0.8 microns ($\mu$m) is considered acceptable in a 4 megabit (Mb) dynamic random access memory (DRAM) IC, 256 Mb DRAM IC's preferably employ interconnect lines as thin as 0.25 microns or even thinner.

As the feature sizes shrink, it becomes increasingly difficult to align the etched conductive features in the overlying conductive layer, e.g., conductive layer 106, with via 112 to ensure a satisfactory electrical connection. By way of example, tolerance in the fabrication process may cause the overlying conductive line etched from conductive layer 106 to be somewhat misaligned with respect to via 112, thereby exposing a portion of adhesion layer 116 to the etch process employed to etch the desired conductive lines out of conductive layer 106.

To illustrate the foregoing, FIG. 2 depicts the layer stack 10 of FIG. 1 after conductive layer 106 is etched in accordance with a conventional etch process. In the example of FIG. 2, feature 202 may represent for example a conductive line etched from conductive layer 106 and disposed in the direction orthogonal to the page, i.e., going into the page. Feature 206 may represent for example a conductive line etched out of conductive layer 202 and disposed in a direction orthogonal to feature 202, i.e., going left to right of the figure.

In FIG. 2, conductive feature 202 is horizontally displaced (due to tolerance in the manufacturing process for example) relative to the center of via 112, thereby exposing the left portion of adhesion layer 116 to the etch process that is employed to etch through conductive layer 106 to form conductive feature 202. Since adhesion layer 116 typically comprises, as mentioned, a similar material as that employed in barrier layer 108, it may be similarly reactive with the etchant employed to etch through conductive layer 106. Accordingly, a portion of adhesion layer 116 may be inadvertently etched, leading to reduced adhesion between plug 114 and the walls of via 112 within insulating layer 104.

In some cases, the undue exposure of a portion of adhesion layer 116 to the conductive layer etch process, e.g., in the conductive layer overetch step, may allow some of the etchant materials to seep into the underlying conductive layer 102 along the damaged adhesion layer. As a consequence, a portion of the underlying conductive layer feature 206 may be inadvertently exposed to the conductive layer etchant material and become inadvertently eaten away. The damaged portion of conductive feature 206 in underlying conductive layer 102 is symbolically shown as damaged portion 204 in the example of FIG. 2. If a sufficient amount of conductive material in underlying conductive feature 206 is damaged, an unintended open circuit may result, either before or after a current is applied. As can be appreciated by those skilled, this inadvertent etching of adhesion layer 116 and features underlying conductive layer 102 is undesirable as it may reduce circuit reliability and yield.

In view of the foregoing, there are desired improved techniques for minimizing inadvertent damage to the underlying conductive features and/or to the adhesion layer within the via while etching the overlying conductive features in the overlying conductive layer.

SUMMARY OF THE INVENTION

The invention relates, in one embodiment, to a method in a substrate processing chamber for forming a conductive feature by etching through a conductive layer disposed above a semiconductor substrate. The method includes etching at least partially through the conductive layer using a first etch recipe to form a top portion of the conductive feature. The method further includes thereafter etching at least partially through a remaining thickness of the conductive layer using a second etch recipe different from the first etch recipe to form a bottom portion of the conductive feature. The bottom portion is disposed below the top portion. The second etch recipe is configured to yield a sloped etch foot in the bottom portion of the conductive feature.

In another embodiment, the invention relates to an integrated circuit having components formed on a semiconductor substrate. The integrated circuit includes a first conductive feature etched from a first conductive layer disposed above the semiconductor substrate. The integrated circuit further includes an insulating layer disposed above the first conductive feature. The insulating layer has therein a via.

The integrated circuit further includes a conductive plug disposed in the via. The conductive plug is electrically coupled to the first conductive feature. There is also included a second conductive feature disposed above the via. The conductive feature is etched from a second conductive layer disposed above the insulating layer. The conductive feature is electrically coupled with the conductive plug disposed in the via and includes a top portion having a first etch profile and a first width, and a bottom portion disposed below the top portion. The bottom portion has a second etch profile different from the first etch profile and a second width wider than the first width.

In yet another embodiment, the invention relates to a method in a plasma processing chamber for preventing damage to an underlying conductive feature while forming an overlying conductive feature out of an overlying conductive layer. The overlying conductive layer is separated from the underlying conductive feature by an insulating layer having therein a conductive plug disposed in a via. The conductive plug couples the overlying conductive feature and the underlying conductive layer through the insulating layer.

The method includes etching at least partially through the overlying conductive layer using a first etch recipe to form a top portion. The top portion has a first width. The method further includes etching at least partially through a remaining thickness of the overlying conductive layer using a second etch recipe different from the first etch recipe to form a bottom portion of the overlying conductive feature. The bottom portion has a second width larger than the first width and a diameter of the via.

These and other advantages of the present invention will become apparent upon reading the following detailed descriptions and studying the various drawings.

DETAILED DESCRIPTION OF THE PREFERRED EMBODIMENTS

Figure 1:
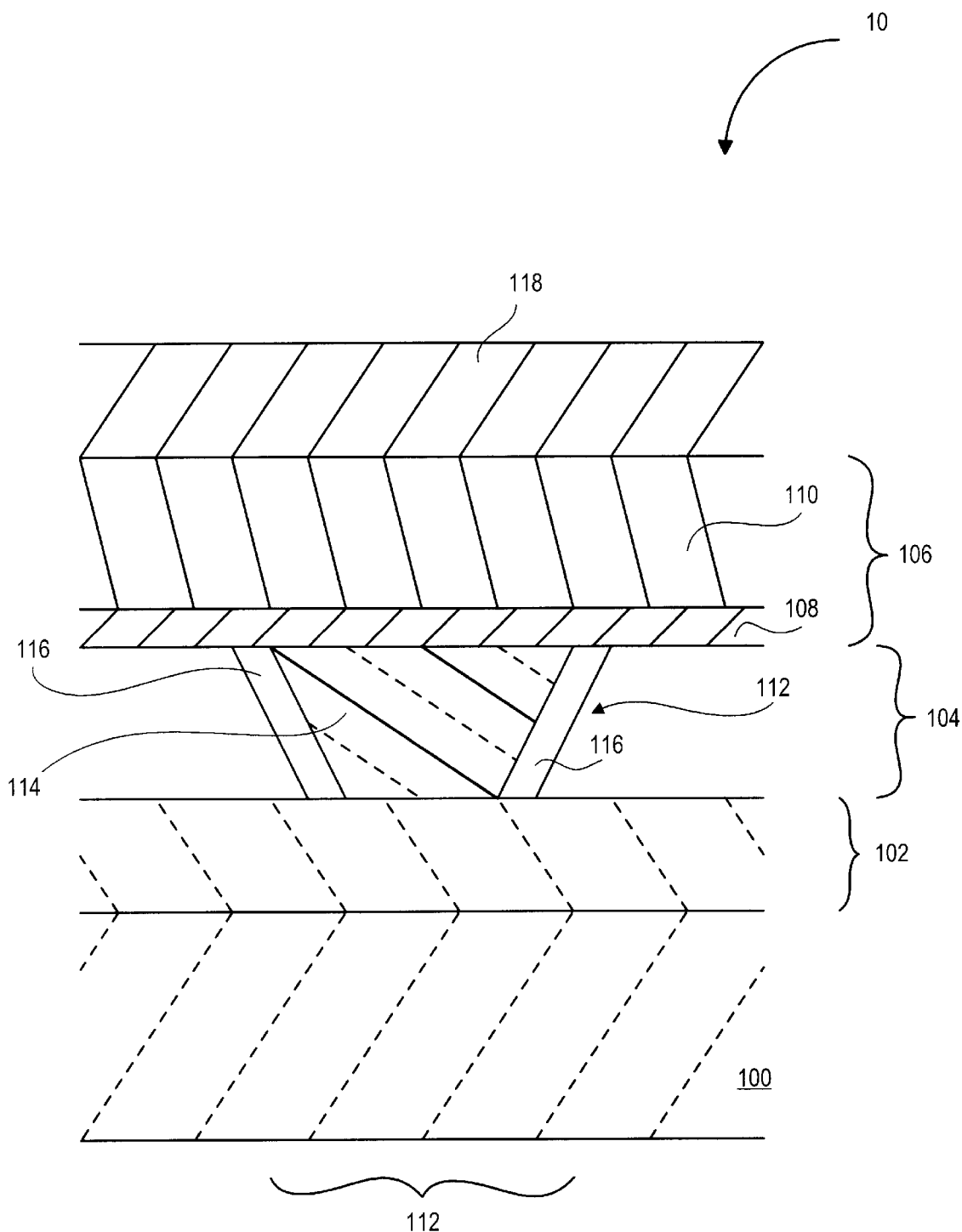
FIG. 1 illustrates a cross-sectional view of a layer stack, representing the layers that may be formed during the fabrication of a typical semiconductor device.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

In accordance with one aspect of the present invention, the aforementioned yield reduction problem is alleviated by etching the conductive layer in at least two steps. In the first conductive layer etch step, the conductive layer is preferably etched with a bulk etch recipe to achieve a high etch rate (thereby yielding a high wafer throughput) and/or substantially anisotropic etch effects. In the second conductive layer etch step, the remaining thickness of the conductive layer is etched with an etch recipe configured to form a sloped etch foot in the resulting conductive feature.

The sloped etch foot, being larger in its cross-section than the more anisotropically etched portion of the conductive layer (formed during the bulk conductive etch step, i.e., the first etch step) may more effectively overlap the vulnerable adhesion layer within the via in the event the etched conductive feature is misaligned relative to the via, e.g., due to tolerance in the fabrication process. In this manner, the invention advantageously facilitates increased protection of the underlying via adhesion layer and/or features in the underlying conductive layer without requiring a concomitant increase in the design rules, i.e., requiring thicker conductive features be etched during the bulk etch step by specifying wider photoresist mask features.

The inventive conductive layer etch technique may be performed in any of the known plasma processing apparatuses, including those adapted for dry etching, plasma etching, reactive ion etching (RIE), magnetically enhanced reactive ion etching (MERIE), electron cyclotron resonance (ECR), or the like. To further elaborate, in a typical plasma processing chamber adapted for dry etching, the wafer is treated with plasma. The chamber includes an inlet port through which process etchant source gases are supplied to the chamber interior. A suitable RF energy source is applied to electrodes associated with the chamber to induce a plasma from the etchant source gases. The energy itself may be coupled inductively or capacitively to sustain the plasma, as is known. Species are then formed from the etchant source gas to react with the layer stack and etch away at the plasma-contacting regions of the wafer layer stack. The by-products, which may be volatile, are then exhausted through an exit port.

Plasma etching relates to the situation where the wafer is positioned on the anode, or ground electrode during wafer processing. On the other hand, reactive ion etching (RIE) relates to the situation where the wafer is positioned on the cathode, or powered electrode during processing. Magnetically enhanced reactive ion etching (MERIE) represents a variant of the RIE reactor geometry wherein a magnetic field is applied to reduce the loss of energetic electrons to the reactor wall surfaces. It has been found that the MERIE reactors, under certain conditions, can increase the efficiency of the energy transfer from the electrodes to the electrons in the plasma.

It is contemplated that the invention may be practiced in any of the above reactors, as well as other suitable plasma processing reactors. Note that the above is true irrespective of whether energy to the plasma is delivered through capacitively coupled parallel electrode plates, through ECR microwave plasma sources, or through inductively coupled RF sources such as helicon, helical resonators, and transformer coupled plasma (whether or not planar). ECR and TCP™-brand (transformer coupled plasma) processing systems, among others, are readily available commercially. TCP™-brand systems are available from, for example, Lam Research Corporation of Fremont, Calif.

Figure 3:
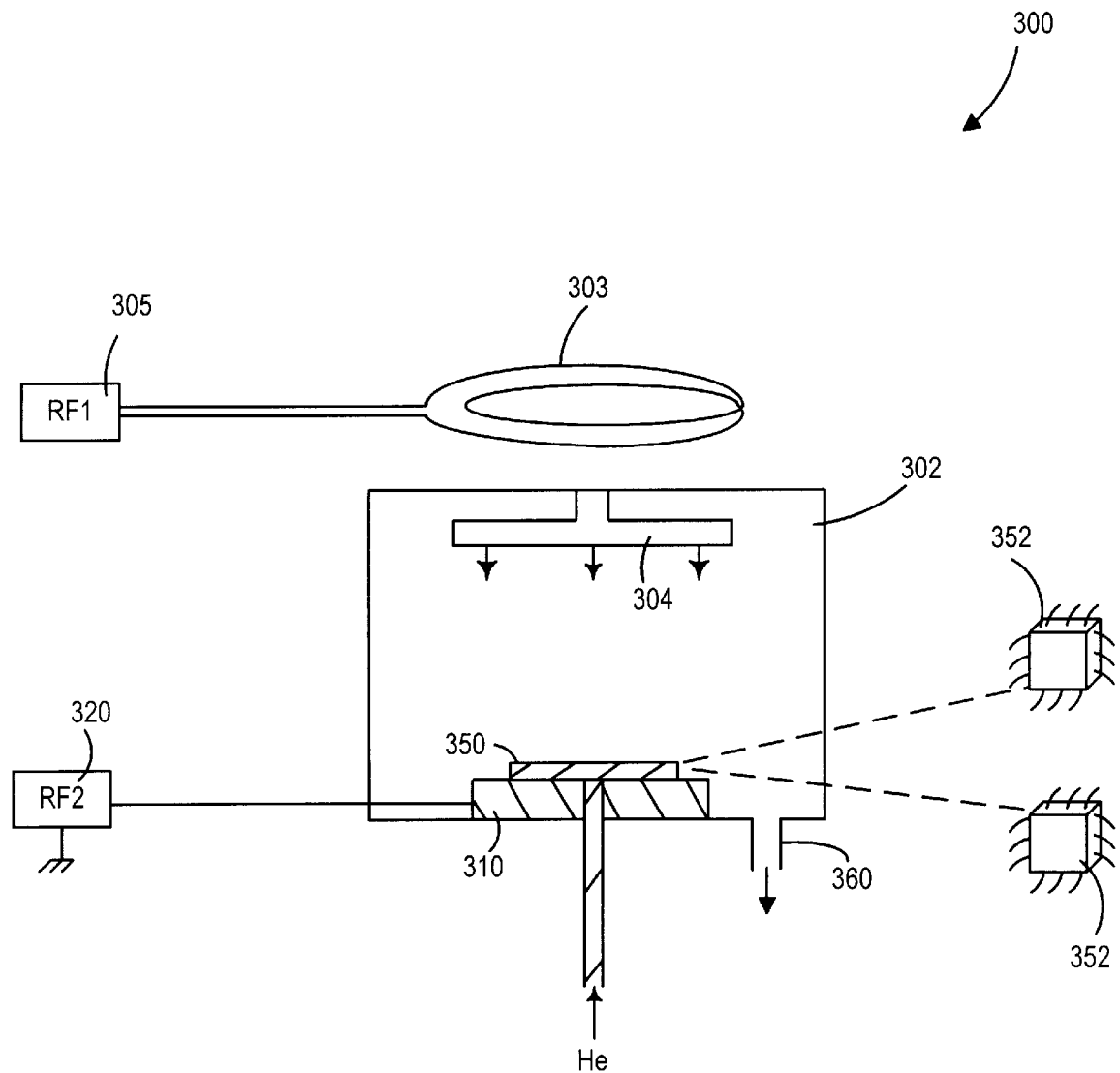
FIG. 3 illustrates a simplified schematic of the TCP™ 9600 SE plasma reactor, representing an etching reactor suitable for use with the inventive etch technique.

In a preferred embodiment, the present invention is employed in a TCP™ 9600 SE plasma reactor, which is available from Lam Research Corporation, although, as mentioned above, any conventional and suitable plasma processing systems may well be employed. FIG. 3 illustrates a simplified schematic of the TCP™ 9600 SE plasma reactor, including substrate 350 and exemplary integrated circuit chips 352, which are fabricated from dies cut from substrate 350 after the substrate is etched according to the inventive etch and processed in conventional post-etch steps. It should be borne in mind that although IC wafers are employed herein as an example for ease of discussion, the inventive etch process may apply to the etching of any substrate, e.g., a flat display panel.

Referring to FIG. 3, a reactor 300 includes a plasma processing chamber 302. Above chamber 302, there is disposed an electrode 303, which is implemented by a coil in the example of FIG. 3. Coil 303 is energized by a RF generator 305 via a matching network (not shown in FIG. 3).

Within chamber 302, there is provided a shower head 304, which preferably includes a plurality of holes for releasing gaseous source materials, e.g., the etchant source gases, into the RF-induced plasma region between shower head 304 and substrate 350. The gaseous source materials may also be released from ports built into the walls of the chamber itself or from a gas ring (which may be annular) disposed in the chamber. Substrate 350 is introduced into chamber 302 and disposed on a chuck 310, which acts as a second electrode and is preferably biased by a radio frequency generator 320 (also typically via a matching network).

Helium cooling gas is introduced under pressure between chuck 310 and substrate 350 to act as a heat transfer medium for accurately controlling the substrate's temperature during processing to ensure uniform and repeatable etching results. During plasma etching, the pressure within chamber 302 may be regulated by withdrawing gas through port 360. A plurality of heaters (omitted from FIG. 3 to simplify the illustration) may be provided to maintain a suitable chamber temperature for etching. To provide an electrical path to ground, the chamber wall of chamber 302 is typically grounded.

Figure 2:
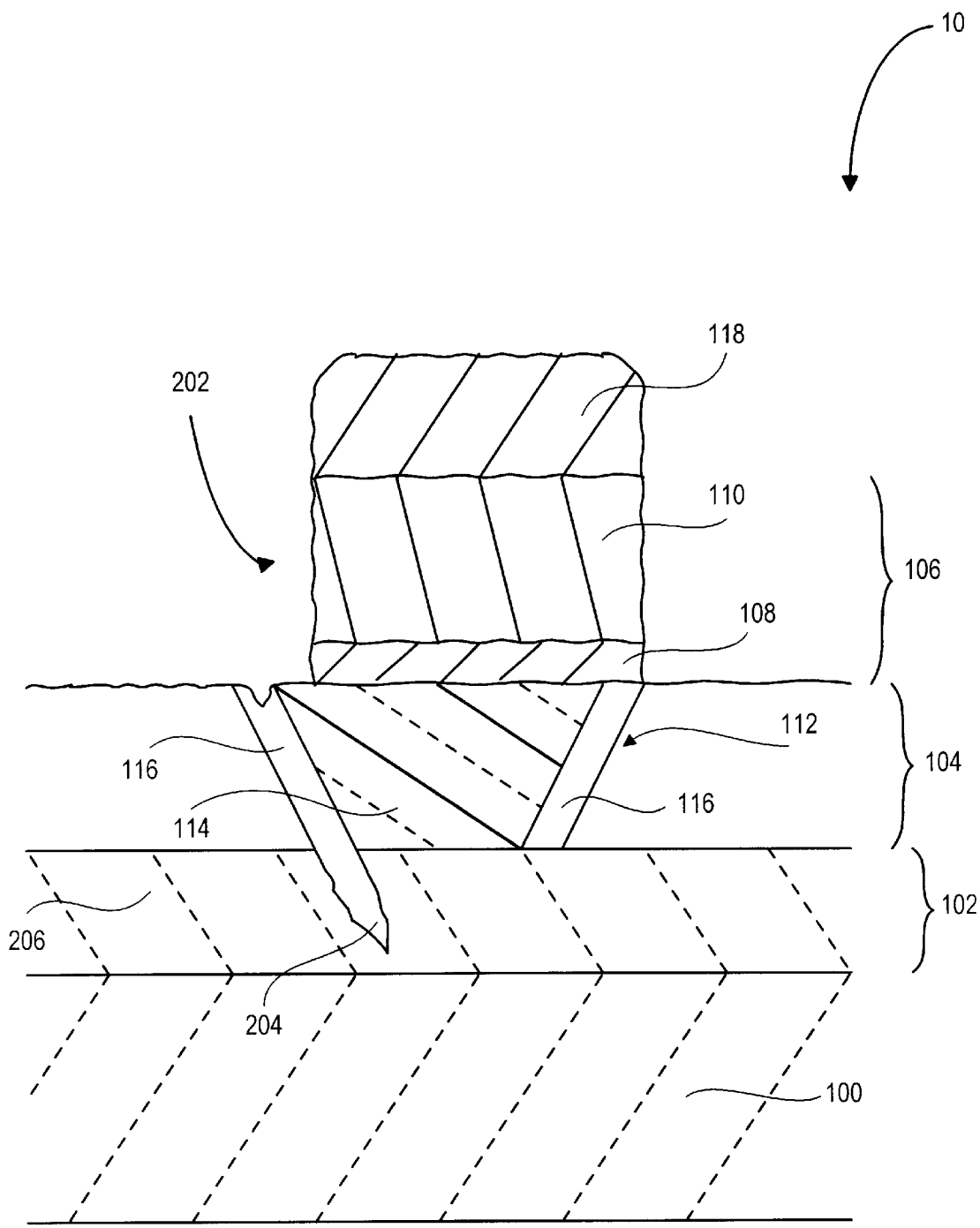
FIG. 2 depicts the layer stack of FIG. 1 after the conductive layer is etched in accordance with a conventional etch process.

As mentioned earlier, damage to the adhesion layer between the conductive plug and the walls of the via in the oxide layer (which may lead to damage to features in the underlying metal layer such as feature 206 of FIG. 2) is advantageously reduced, in accordance with one aspect of the present invention, by purposely inducing a sloped etch foot in the etched conductive feature. The sloped etch foot of the etched conductive feature, with its larger footprint at the point where the conductive layer intersects the insulating layer, advantageously increases the probability that the etched conductive feature will more completely overlap the via in the insulating layer even if some tolerance-induced misalignment between the etched conductive feature and the underlying via occurs. Accordingly, the probability that an area of the annular ring of the adhesive layer in the via is exposed to the etch process employed to etch the overlying conductive layer is advantageously minimized, concomitantly minimizing the probability of adhesive layer and/or underlying conductive layer feature damage.

Note that the inventive conductive etch technique reduces, in one embodiment, the potentiality for adhesive layer and/or underlying conductive feature damage by performing, after a bulk etch step, the nonobvious etching step that intentionally creates the conductive feature sloped etch foot. This intentional introduction of a sloped etch foot is contrary to current efforts in etch designs, which strive to achieve a more anisotropic etch through the etch feature, i.e., a substantially vertical sidewall from the top of the etched feature to the bottom of the etched feature.

As mentioned, the sloped etch foot, which is typically undesired in modern etch processes which strive for vertical etch sidewalls, advantageously enhances protection of the adhesive layer in this case without requiring the top portion of the conductive feature to be enlarged. Since the dimension of the top portions of the conductive features remain unchanged, the photoresist features patterned to facilitate etching the conductive features out of the overlying conductive layer may still be patterned using existing photoresist patterning tools. Advantageously, no changes in the photoresist patterning tools and/or photoresist patterns are necessary to achieve the improved yield offered by the invention.

Figure 4:
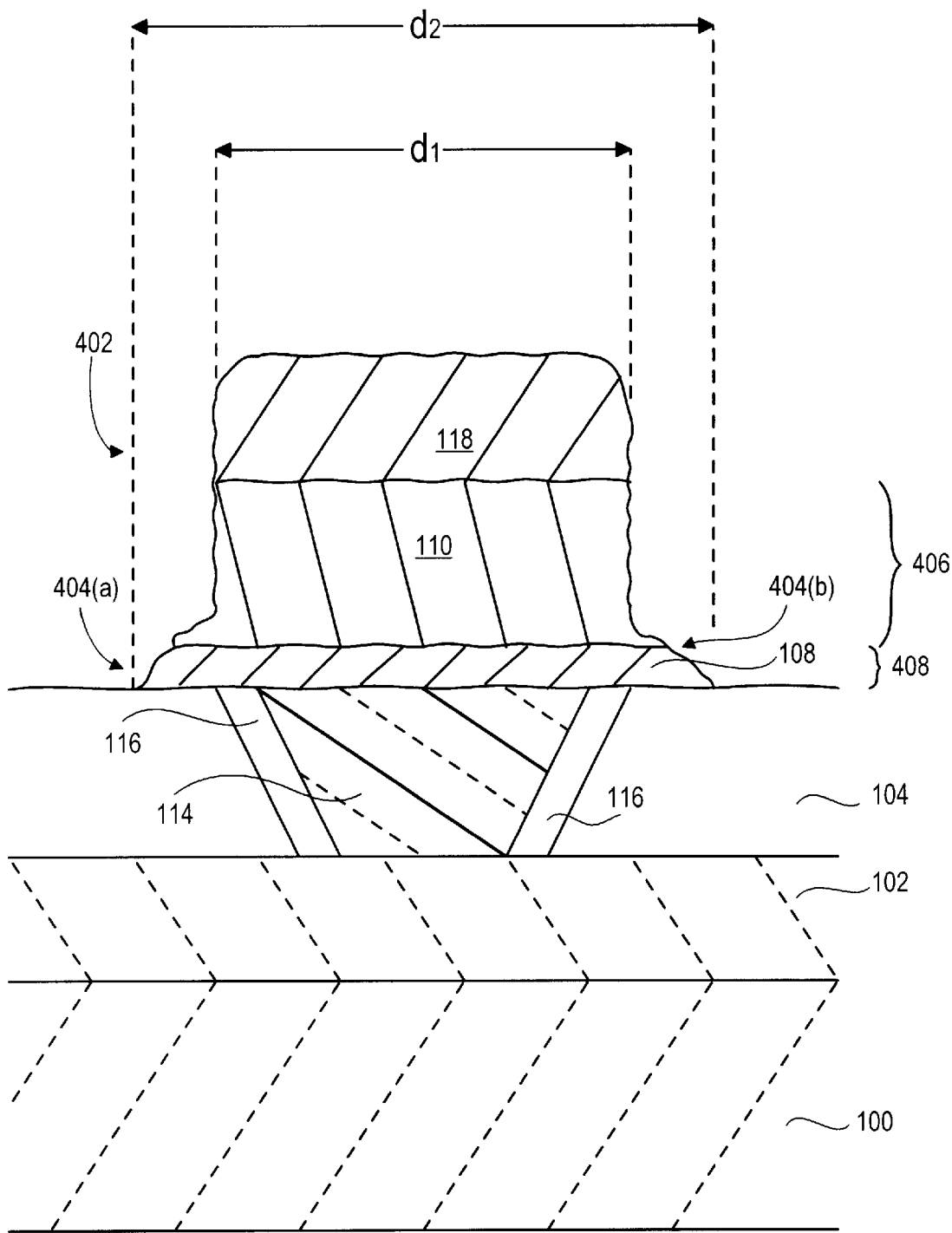
FIG. 4 depicts a conductive feature that includes a sloped etch foot formed in accordance with one embodiment of the inventive etch technique.

To facilitate discussion of the features and advantages of the invention, FIG. 4 depicts, in accordance with one embodiment of the present invention, a conductive feature 402, which includes a sloped etch foot formed in accordance with the inventive etch technique. In FIG. 4, substrate 100, underlying conductive layer 102, insulating layer 104, barrier layer 108, plug 114 and adhesive layer 116 are substantially similar to structures having like reference numbers in FIGS. 1 and 2. Conductive feature 402, which is shown with patterned photoresist portion 118 still disposed thereon, includes sloped foot portion 404(a) and 404(b).

As shown in FIG. 4, the top portion 406 of conductive feature 402 has a width d1, which is determined by the width of patterned photoresist portion 118. Advantageously, the photoresist mask, whose features have widths d1, may be formed using existing/conventional photoresist patterning tools and/or photoresist design rules. For example, width d1 may be (but is not required to be) narrower than the diameter of the via over which conductive feature 402 is disposed. Top portion 406 represents the portion of the conductive layer that is bulk-etched, preferably with an etch process that is optimized for a fast etch rate and/or substantially vertical sidewalls.

The bottom portion 408 of conductive feature 402, which typically includes at least a portion of barrier layer 108, has a width d2, which is advantageously wider than width d1 to provide greater protection for adhesive layer 116 and/or features in underlying conductive layer 102. Bottom portion 408 preferably has a different etch profile than the etch profile of the top portion. For example, the top portion may have, in one embodiment, a substantially anisotropic etch profile while the second etch portion may be more sloped, i.e., having a more enlarged footprint.

In one embodiment, width d2 is preferably larger than the diameter of the via over which conductive feature 402 is disposed. However width d2 should not be so large as to cause adjacent features to undesirably short together. As can be appreciated, the exact dimension of width d1 and d2 may vary from device to device and from process to process. As shown, protection of adhesive layer 115 is more effectively provided by bottom portion 408 (with its sloped foot portions 404(a) and 404(b)) even if conductive feature 402 is misaligned relative to the via in insulating layer 104, e.g., due to tolerance in the patterning and/or fabrication process.

As mentioned earlier, bottom portion 408 of conductive feature 402 may include at least a portion of barrier layer 108. Of course if the conductive layer does not require a barrier layer, bottom portion 408 may simply represent a portion of the overall conductive layer. If barrier layer 108 is provided, the bulk etching step that forms top portion 406 may, in one embodiment, terminate before the interface between interconnect layer 110 and barrier layer 108 is reached. In other words, bottom portion 408 may include at least a portion of interconnect layer 110 and the entirety of barrier layer 108. In another embodiment, bottom portion 408 includes only barrier layer 108, i.e., the bulk etch step that forms top portion 406 may terminate at the interface between interconnect layer 110 and barrier layer 108. In yet another embodiment, bottom portion 408 may include only a portion of barrier layer 108, i.e., the bulk etch step that forms top portion 406 is allowed to proceed beyond the interface between interconnect layer 110 and barrier layer 108 into at least a portion of the barrier layer. It should be appreciated that the exact depth of the bulk etch (and concomitantly the exact thickness of bottom portion 408) depends on the desired width d2 and the slope of sloped portion 402(a) and/or 402(b).

In one embodiment, the etching step that forms bottom portion 408 (i.e., the etch step performed after the bulk etch step) may be performed in a single step. In another embodiment, the etching step that forms bottom portion 408 may include multiple steps. For example, one etching step may be employed to etch through the remainder of interconnect layer 110, and another etching step may be employed to both etch through barrier layer 108 and to perform the overetch step through the barrier layer. Overetch is a concept well known to those skilled in the art and refers to the etching that is performed to ensure that traces of conductive and/or barrier materials in areas where they are not desired, i.e., where there is no protective photoresist, are substantially removed. As a further example, one etching step may be employed to etch through the remainder of interconnect layer 110, another etching step may be employed to etch through barrier layer 108, and yet another etch step may be employed to perform the overetch step through the barrier layer.

In accordance with one aspect of the present invention, the sloped etch foot of conductive feature 402 is formed by employing a recipe similar to the bulk etch recipe, albeit with one or more of its parameters is altered to induce the sloped etch foot. For example, the etch rate of the bulk etch recipe may be decreased to facilitate the formation of the etch foot. While not wishing to be bound by theory, it is believed that conductive layer etching erodes the protective photoresist features, e.g., photoresist feature 118 of FIG. 4, over time. Some of the eroded photoresist material polymerizes along the sidewalls of the formed conductive feature, e.g., conductive feature 402, during the etch. If the vertical etch rate through conductive feature 402 is decreased, the polymer has more time to build up, e.g., at the corner where the sidewall of the conductive feature undergoing etching and the surface of the partially etched conductive layer intersects. The increase in lateral polymer deposition increases protection of the conductive layer in this area, thereby causing the conductive layer to etch less anisotropically as the etch proceeds, i.e., forming a conductive etch foot as the etch proceeds downward through the conductive layer.

As an alternative or additional mechanism, the temperature of the electrode on which the substrate is disposed may be lowered. Again, while not wishing to be bound by theory, it is believed that lowering the electrode temperature (and concomitantly the temperature of the substrate undergoing etching) increases the rate at which polymer particles condense or precipitates on the substrate. An increase in polymer condensation increases polymer deposition, thereby facilitating the formation of the etch foot in a manner similar to that described earlier in connection with lowering the etch rate. The temperature of the substrate may be decreased by, for example, increasing the helium backside cooling pressure in one embodiment, thereby increasing the rate of heat transfer between the substrate undergoing processing and the chuck.

As yet another alternative or additional mechanism, the DC bias of the electrode on which the substrate is disposed may be increased to facilitate the formation of an etch foot. Increasing the lower electrode bias has the effect of increasing the sputtering component of the etch, which increases the rate of photoresist erosion and increases the rate of polymer deposition.

Figure 5:
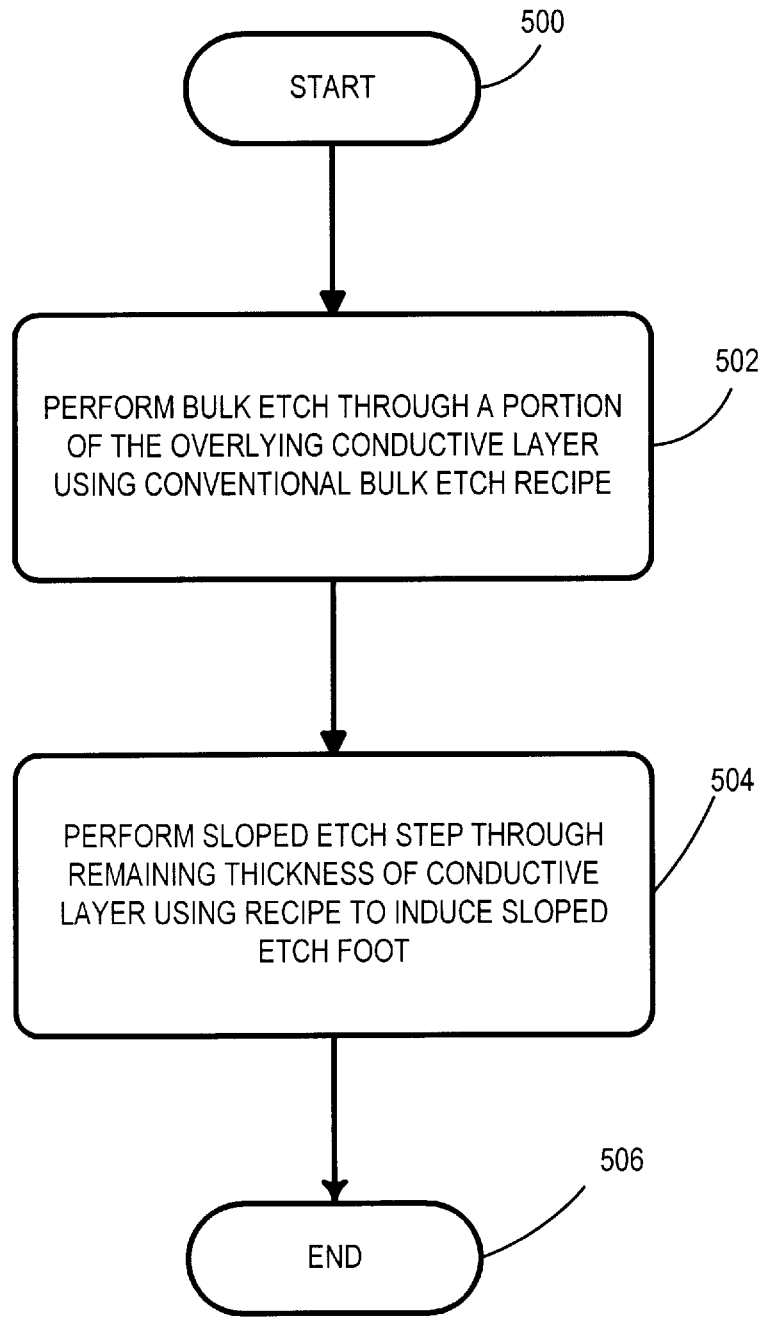
FIG. 5 illustrates, in accordance with one embodiment of the present invention, the inventive etch technique for forming the sloped etch foot.

FIG. 5 illustrates, in accordance with one embodiment of the present invention, the inventive etch technique for forming the sloped etch foot. In step 502, at least a portion of the overlying conductive layer, e.g., conductive layer 106 of FIG. 1, is etched using a bulk etch recipe. As mentioned earlier, the bulk etch recipe is preferably configured to maximize the etch rate through the conductive layer to increase substrate throughput. Additionally or alternatively, the bulk etch step may, in some cases, be configured to form substantially anisotropic etch features, i.e., substantially vertical etch sidewalls. In step 504, the remainder of the conductive layer is etched using a recipe configured to induce the sloped etch foot. In one example, step 502 terminates before the interconnect layer, e.g., interconnect layer 110 of FIG. 1, is etched through. In another example, step 502 may be employed to etch substantially through the interconnect layer, e.g., interconnect layer 110 of FIG. 1, and step 504 may be employed to etch through the barrier layer, e.g., barrier layer 108 of FIG. 1, and as an overetch step.

In one embodiment, the recipe employed in step 504 is substantially similar to the recipe employed in step 502, albeit with one or more of the bulk etch parameters altered. As mentioned earlier, the sloped etch foot may be formed when the etch rate through the conductive layer is reduced, the temperature of the electrode on which the substrate is disposed is reduced, and/or the DC bias of the lower electrode is increased. Other parameters may be varied from those employed in the bulk etch of step 502 in order to achieve the sloped foot etch.

Figure 6:
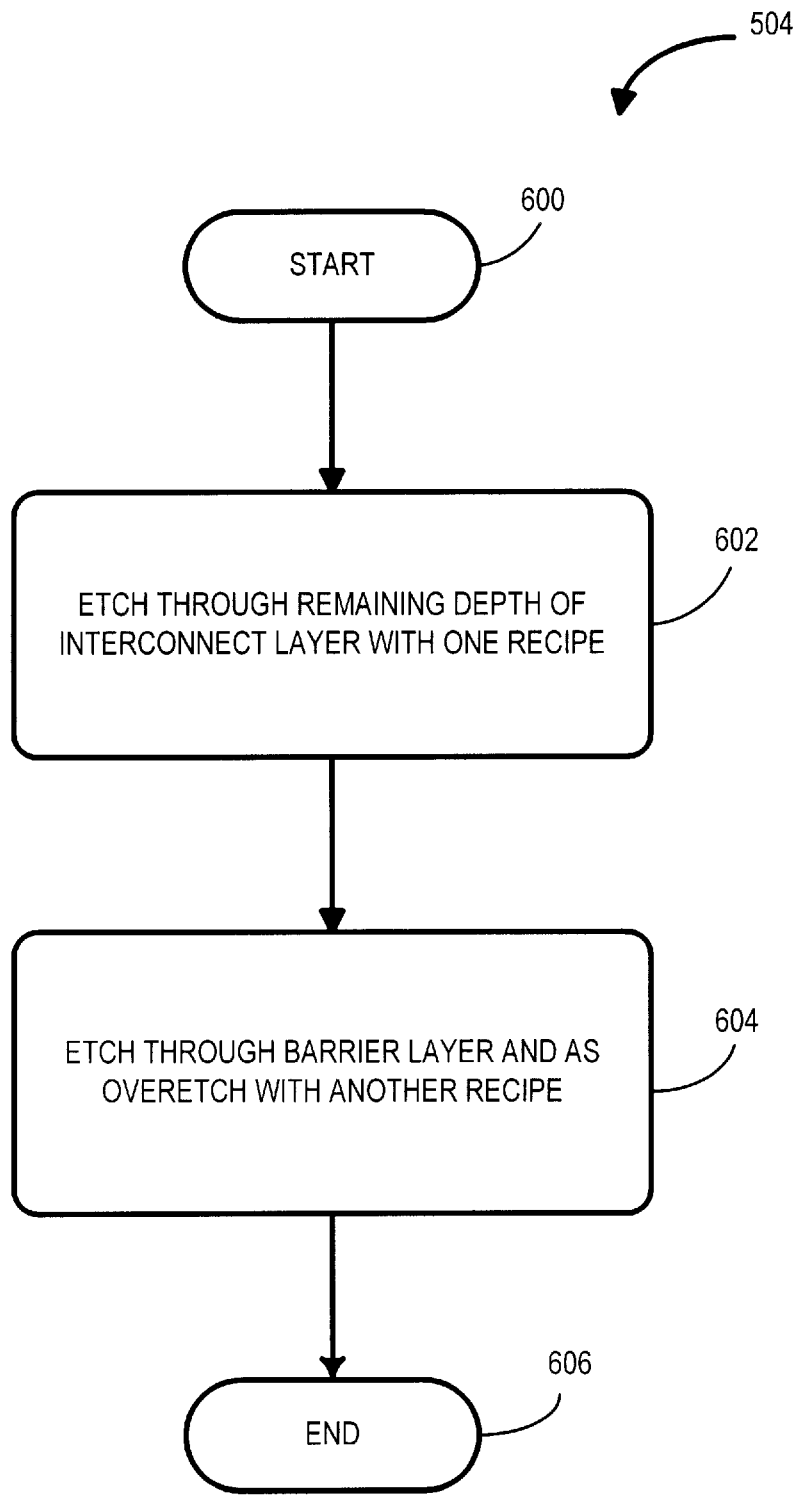
FIG. 6 illustrates one embodiment of the invention wherein the portion of the conductive layer remaining after the bulk etch step is etched in two separate etching steps.

As mentioned earlier, the etching step configured to induce the sloped etch foot may include one or more separate etching steps. For example, after the bulk etch is completed, a separate etching recipe may be employed to etch through the remaining portion of the interconnect layer, e.g., interconnect layer 110 of FIG. 1. Another barrier etch recipe may be employed to etch through the barrier layer, e.g., barrier layer 108 of FIG. 1, and as an overetch recipe. FIG. 6 illustrates this embodiment wherein the sloped etch foot etch step 504 of FIG. 5 is accomplished in two separate etching steps 602 and 604. In FIG. 6, preferably step 602 and/or step 604 may represent the etch step(s) configured to induce the sloped etch foot.

Figure 7:
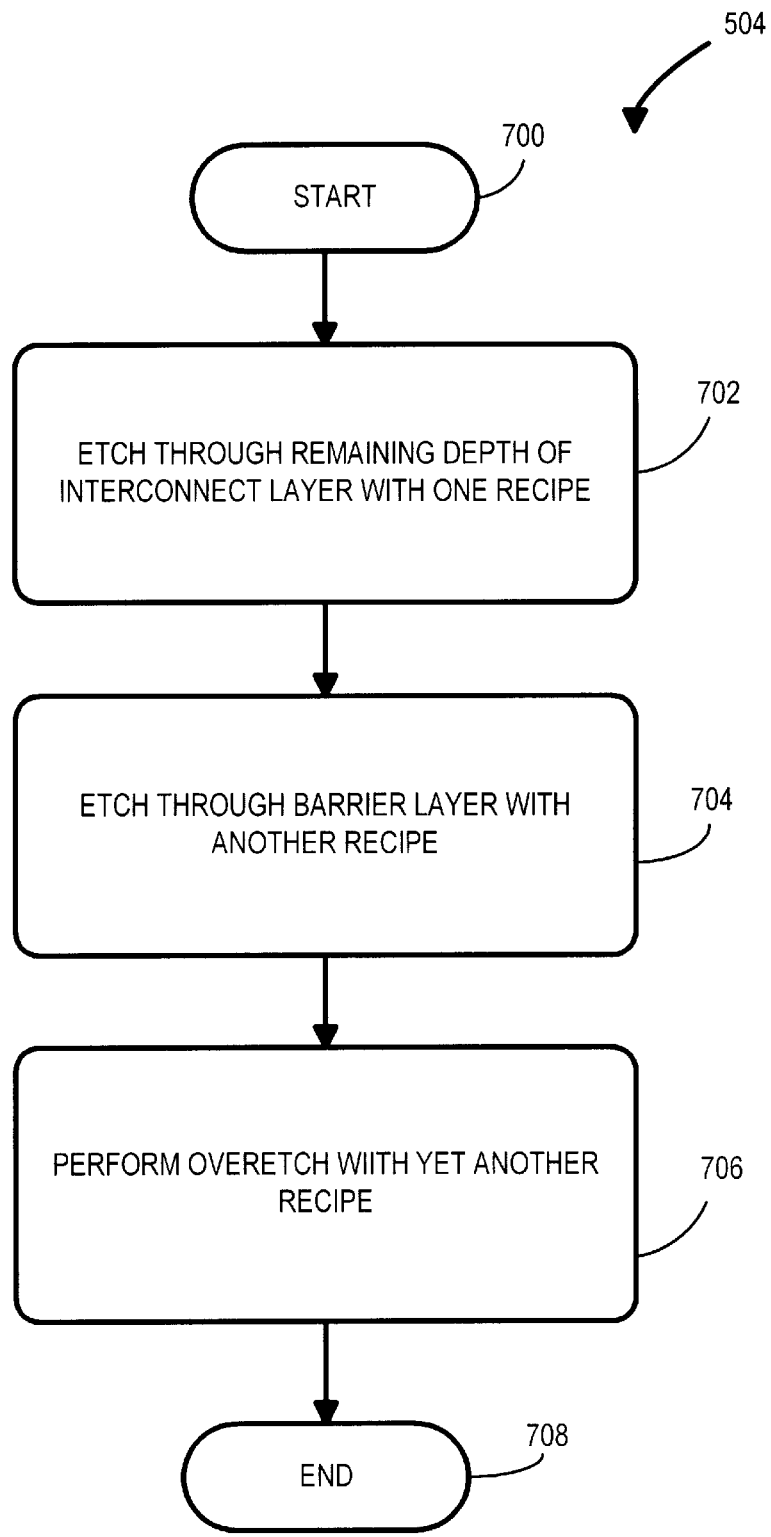
FIG. 7 illustrates one embodiment of the invention wherein the portion of the conductive layer remaining after the bulk etch step is etched in three separate etching steps.

In yet another embodiment, another etch recipe may be employed to perform the overetch step. FIG. 7 illustrates an alternative embodiment wherein the sloped etch foot etch step 504 of FIG. 5 is accomplished in three separate steps. In step 702, the remaining portion of the interconnect layer (leftover after step 502 of FIG. 5 is completed) is etched preferably using a recipe configured to form the sloped etch foot.

In step 704, the barrier layer, e.g., barrier layer 108 of FIG. 1, is etched using a barrier etch recipe. Since step 702 may already form the sloped etch foot, it is not always necessary that the barrier etch recipe employed in step 704 be configured to induce a sloped etch feature in the barrier layer. This is particularly true for layer stacks whose barrier layers may be relatively thin. However, the barrier etch recipe employed in step 704 may be so configured, in one embodiment, to further enlarge or substantially maintain the sloped etch foot. In step 706, a separate overetch recipe may be employed to clean up any trace of the conductive material in areas where conductive material is not desirable, e.g., in between the etched features and in the open field regions.

In the following paragraphs, approximate ranges of parameters suitable for inducing the sloped etch foot on the etched conductive features are disclosed. These parameter ranges are contemplated to be suitable for etching aluminum alloy conductive layer, which may be provided with a barrier layer comprising Ti TiN, or TiW. In the fluorine chemistry case, the optional barrier layer may comprise, for example, W or TiW. Although the suitable ranges are disclosed hereinbelow in connection with 100 mm and 200 mm wafers in a TCP™ 9600 SE plasma reactor, these ranges should serve as guidelines to enable one skilled in the art to adapt the disclosed etch technique to wafers having other dimensions and/or other etch reactors (whether or not plasma is involved).

100 mm Wafer Etched Using Chlorine Chemistry In TCP™ 9600 SE Plasma Reactor

For a 100 mm wafer etched using chlorine chemistry, the total flow of the etchant source gas (in standard cubic centimeters per minute) is between about 40 standard cubic centimeters per minute (sccm) and about 150 sccm, more preferably between about 40 sccm and about 200 sccm, and preferably at about 70 sccm. The $Cl_2$ to $BCl_3$ ratio is between about 0.25 and about 2.0, more preferably between about 0.5 and about 1.3, and preferably at about 1.0.

The top power to the coil power may be between about 200 watts (W) and about 500 W, more preferably between about 350 W and about 450 W, and preferably at about 475 W. The ratio of the top power to the bottom electrode power may be between about 1.15 and about 3.0, more preferably between about 1.2 and about 1.45, and most preferably at about 1.35.

The pressure within the chamber interior, in milliTorr (mT), is between about 4 mT and about 25 mT, more preferably between about 8 mT and about 15 mT, and most preferably at about 10 mT. Backside helium cooling pressure, in Torr (T), may be between 0 Torr (T) and about 20 T, more preferably between about 8 T and about 12 T, and most preferably at about 10 T.

Additionally, polymer deposition enhancing gas may be provided. In one embodiment, nitrogen ($N_2$) is supplied (in sccm) at between about 3 sccm to about 25 sccm, more preferably between about 5 sccm to about 10 sccm, and most preferably at about 5 sccm. Oxygen (O2) may optionally be provided, additionally or alternatively, at between about 3 sccm and about 15 sccm, more preferably between about 3 sccm and about 5 sccm, and most preferably at about 4 sccm. Further, fluorocarbon gases, e.g., any of the freon gases, may be added additionally or alternatively (in sccm) between about 3 sccm to about 15 sccm, more preferably between 3 sccm and about 10 sccm, and most preferably about 5 sccm. Further, hydrocarbon gases, e.g., methane, may be added, additionally or alternatively, at between about 3 sccm and about 15 sccm, more preferably between about 3 sccm and about 10 sccm, and most preferably at about 4 sccm.

100 mm Wafer Etched Using Fluorine Chemistry In TCP™ 9600 SE Plasma Reactor.

In one embodiment, fluorine chemistry may alternatively or additionally be employed. If fluorine chemistry is employed, the parameters mentioned earlier in connection with the chlorine chemistry, e.g., the chamber pressure, backside helium cooling pressure, and polymer deposition enhancing gasses, may apply. However, the RF power for the fluorine chemistry may be between about 200 W and about 600 W, more preferably between about 400 W and about 500 W, and preferably at about 500 W.

The ratio of the top power to bottom electrode power may be between about 2 to about 24, more preferably between about 2.5 and about 6, and most preferably at about 3. The total volume of etchant gas (in sccm) may be between about 30 sccm to about 100 sccm, more preferably between about 40 sccm and about 60 sccm, and most preferably at about 50 sccm The ratio of $SF_6$ to $BCl_3$ may be between about 0.5 to about 4.0, more preferably between about 1.0 to about 3.0, and most preferably at about 1.2. Optionally chlorine ($Cl_2$) may be added between about 1% to about 60%, more preferably between about 10% and 30%, and preferably at about 20% of the total gas flow. Polymer deposition enhancing gas may also be provided. For example, nitrogen ($N_2$) may be provided between about 5 sccm and about 10 sccm, and more preferably at about 5 sccm 200 mm Wafer Eched Using Chlorine Chemistry In TCP™ 9600 SE Plasma Reactor.

In one embodiment, the top RF power may be between about 250 W and about 700 W, more preferably between about 400 W and about 550 W, and most preferably at about 450 W. The top electrode power to the bottom electrode power ratio may be between about 1.15 and about 3.0, more preferably between about 1.2 and about 1.45, and most preferably at about 1.2.

The total volume of etchant source gas may be between about 40 sccm and about 400 (sccm), more preferably between about 40 sccm and about 200 sccm, and most preferably at about 100 sccm. The $Cl_2$ to $BCl_3$ ratio may be between about 0.25 and about 2.0, more preferably between about 0.5 and about 1.3, and most preferably at about 0.6. The chamber interior pressure may be between about 4 milliTorrs (mT) and about 25 mT, more preferably between about 8 mT and about 15 mT, and most preferably at about 10 mT. The backside helium cooling pressure may be between about 0 T and about 20 T, more preferably between about 8 T and about 12 T, and most preferably at about 12 T.

Polymer deposition enhancing gas may also be provided. For example, nitrogen ($N_2$) may be provided between about 5 sccm and about 10 sccm, and more preferably at about 5 sccm.

200 mm Wafer Eched Using Fluorine Chemistry In TCP™ 9600 SE Plasma Reactor.

As in the 100 mm wafer example, fluorine chemistry may be employed in place of or in addition to the chlorine chemistry etch step. In the fluorine chemistry case, certain parameters associated with the 200 mm wafer chlorine etch example, e.g., chamber interior pressure and backside helium cooling pressure, may be employed. However, the RF top power may be between about 200 W and about 700 W, more preferably between about 400 W and about 600 W, and most preferably at about 600 W. The ratio of the top power to the bottom electrode power may be between about 2 and about 24, more preferably between about 2.5 and about 6, and most preferably at about 3.

The total volume of etchant source gas may be between about 50 sccm and about 150 sccm, more preferably between about 60 sccm and about 100 sccm, and most preferably at about 80 sccm The $SF_6$ to $BCl_3$ ratio may be between about 0.05 and about 4.0, more preferably between about 1.0 and about 3.0, and most preferably at about 2.2. Optionally, $Cl_2$ may be added between about 1 sccm to about 25 sccm, more preferably between about 1 sccm and about 15 sccm, and most preferably at about 10 sccm.

Polymer deposition enhancing gas may also be provided. For example, nitrogen ($N_2$) may be provided between about 3 sccm and about 25 sccm, more preferably between about 5 sccm and about 15 sccm, and most preferably, at about 10 sccm. Oxygen ($O_2$) may alternatively or additionally be added at between about 3 sccm and about 15 sccm, more preferably between 5 sccm and about 10 sccm. Similar number ranges exists for the optional freon and hydrocarbon, which may be employed alternatively or additionally to other polymer deposition enhancing gasses (e.g., between about 3 sccm and about 15 sccm, and more preferably, between 5 sccm and about 10 sccm).

For the fluorine chemistry case, the chamber pressure may be between about 4 milliTorr (mT) and about 25 mT, more preferably between about 8 mT and about 15 mT, and most preferably at about 12 mT. The backside helium cooling pressure may be between about 0 T and about 20 T, more preferably, between about 8 T and about 12 T, and most preferably at about 12 T.

EXAMPLES

Example 1

In a sample etch, a 200 mm wafer having thereon 1,500 angstroms of TiW as a barrier layer, an overlying interconnect layer comprising 5,500 angstroms of Al—Si—Cu, and an overlying anti-reflective coating (ARC) layer comprising 250 angstroms of TiN is processed in a TCP™ 9600 SE plasma reactor. The chemistries employed in the bulk etch include $Cl_2$ and $BCl_3$. The chemistry employed for the sloped etch foot etch step further includes $SF_6$ and $N_2$.

In the stabilize step, the pressure in the chamber is about 12 milliTorr and the backside helium pressure is about 5 Torr. $Cl_2$ and $BCl_3$ etchant source gasses are flowed at about 80 sccm and about 40 sccm respectively. The stabilize step ends when pressure (chamber and/or backside cooling pressure) and gas flow conditions in the plasma reactor are stabilized.

In the breakthrough and aluminum bulk etch step, the pressure within the reactor chamber is maintained the same (at about 12 milliTorr) as is the backside helium cooling pressure (at about 5 Torr). The top electrode power is at about 500 W and the bottom power is at about 350 W. The $Cl_2$ and $BCl_3$ gas flows are about 80 sccm and about 40 sccm respectively. This breakthrough and aluminum bulk etch step ends when an aluminum endpoint is detected, e.g., by monitoring the 261 nm optical emission.

An aluminum overetch and clean-up step is then employed using the same interior chamber pressure (at about 12 milliTorr), and the same RF power (at about 500 W and about 350 W for the top power and bottom electrode power respectively). The $Cl_2$ and $BCl_3$ gas flows in this aluminum overetch/clean-up step are about 50 sccm each. Backside helium cooling pressure is at about 12 Torr. The overetch step is an 80% overetch, i.e., the duration of this overetch etching step is about 80% of the duration of the breakthrough and aluminum bulk etch step.

To create the sloped etch foot in the TiW barrier layer, the RF power, as well as the $Cl_2$ and $BCl_3$ gas flows are changed. For example, in the sloped etch foot etch, the top power and bottom electrode power are about 600 W and about 200 W respectively. The $Cl_2$ and $BCl_3$ gas flows are about 10 sccm and about 25 sccm respectively. Additionally, $SF_6$ gas flow at about 55 sccm is also provided. Polymer deposition enhancing $N_2$ is flowed at about 10 sccm The backside helium cooling pressure is maintained at about 12 Torr and the pressure within the chamber interior is about 12 milliTorr. The sloped etch foot etch step ends when a tungsten endpoint is detected, e.g., by monitoring the 703 nm optical emission.

A TiW overetch and clean-up etch (100% overetch) is also performed. In this TiW overetch step, the interior chamber pressure is maintained at about 12 milliTorr, and the backside helium cooling pressure is at about 5 Torr. The RF power is maintained the same, at about 600 W and 200 W for top power and bottom electrode power respectively. Substantially, no chlorine gas is flowed in the TiW overetch step. However, about 25 sccm of $BCl_3$ and about 80 sccm of $SF_6$ are flowed into the chamber during the TiW overetch step.

Example 2

In another sample etch, a 200 mm wafer having thereon 1,000 angstroms of TiN as a barrier layer, an overlying interconnect layer comprising 7,500 angstroms of Al—Si—Cu, and an overlying anti-reflective coating (ARC) layer comprising 250 angstroms of TiN is processed in a TCP™ 9600 SE plasma reactor.

In the stabilize step, the interior chamber pressure is at about 10 milliTorr. The $Cl_2$ flow and the $BCl_3$ flow are about 90 sccm and 60 sccm respectively. The backside helium pressure is at about 5 Torr. The stabilize step ends when pressure (chamber and/or backside cooling pressure) and gas flow conditions in the plasma reactor are stabilized.

Another etch step is employed to breakthrough the ARC layer and to perform the aluminum bulk etch. In this breakthrough and aluminum bulk etch step, the pressure in the chamber is at about 10 milliTorr. The RF power for the top electrode and the bottom electrode are about 500 watts and 350 watts respectively. Chlorine and BCl3 etchant source gas are flowed at about 90 sccm and about 60 sccm respectively. Backside helium cooling pressure is at about 5 Torr. The breakthrough and aluminum bulk etch ends when an endpoint for the aluminum etch step is detected.

In another etch step, an etch recipe is employed to create the sloped etch foot and to perform an overetch step. In this step, the pressure within the chamber is at about 10 milliTorr. The RF power settings for the top electrode and the bottom electrode are about 450 W and about 375 W respectively. The etchant source gas flows for the $Cl_2$ and $BCl_3$ are about 40 sccm and about 60 sccm respectively. The backside helium cooling pressure is at about 12 Torr. This etch step ends when 100% overetch is achieved.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. In a substrate processing chamber, a method for forming a conductive feature by etching through a conductive layer disposed above a semiconductor substrate, said method comprising:

etching at least partially through said conductive layer using a first etch recipe to form a top portion of said conductive feature; and thereafter etching at least partially through a remaining thickness of said conductive layer using a second etch recipe different from said first etch recipe to form a bottom portion of said conductive feature, said bottom portion being disposed below said top portion, said second etch recipe being configured to yield a sloped etch foot in said bottom portion of said conductive feature.

2. The method of claim 1 wherein said first etch recipe is configured to achieve a higher etch rate through said conductive layer than an etch rate achieved by said second etch recipe.

3. The method of claim 2 wherein said first etch recipe is configured to maximize an etch rate through said conductive layer.

4. The method of claim 1 wherein said substrate processing chamber represents a plasma processing chamber.

5. The method of claim 4 wherein said plasma processing chamber represents a transformer coupled plasma etch chamber.

6. The method of claim 5 wherein said conductive feature is etched using a chlorine chemistry.

7. The method of claim 5 wherein said conductive feature is etched using a fluorine chemistry.

8. The method of claim 5 wherein said transformer coupled plasma etch chamber includes a lower electrode disposed below said substrate, a DC bias of said lower electrode while etching said bottom portion of said conductive feature is higher than a DC bias of said lower electrode while forming said top portion of said conductive feature.

9. The method of claim 1 wherein said substrate is maintained at a lower temperature while etching said bottom portion of said conductive feature than a temperature of said substrate while forming said top portion of said conductive feature.

10. The method of claim 1 wherein said conductive feature is disposed above a via formed in an insulating layer, said insulating layer being disposed below said conductive layer, said top portion of said conductive feature having a width narrower than a diameter of said via, said bottom portion of said conductive feature being at least as wide as said diameter of said via at an interface between said bottom portion of said conductive feature and said via.

11. The method of claim 1 wherein said via includes a conductive plug disposed therein, said conductive plug comprises titanium.

12. The method of claim 11 wherein said via includes a layer disposed between said conductive plug and inner walls of said via.

13. The method of claim 12 wherein conductive plug is in electrical contact with an underlying conductive feature disposed below said insulating layer.

14. The method of claim 13 wherein said semiconductor substrate represents a semiconductor substrate employed for manufacturing integrated circuits.

15. An integrated circuit having components formed on a semiconductor substrate, comprising:

a first conductive feature etched from a first conductive layer disposed above said semiconductor substrate;

an insulating layer disposed above said first conductive feature, said insulating layer having therein a via;

a conductive plug disposed in said via, said conductive plug being electrically coupled to said first conductive feature; and a second conductive feature disposed above said via, said conductive feature being etched from a second conductive layer disposed above said insulating layer, said conductive feature being electrically coupled with said conductive plug disposed in said via and includes a top portion having a first etch profile and a first width, and a bottom portion disposed below said top portion, said bottom portion having a second etch profile different from said first etch profile, said bottom portion having a second width wider than said first width.

16. The integrated circuit of claim 15 wherein said conductive plug comprises tungsten.

17. The integrated circuit of claim 16 wherein said first etch profile is more anisotropic than said second etch profile.

18. The integrated circuit of claim 15 wherein said second width is wider than a diameter of said via.

19. The integrated circuit of claim 18 wherein said first width is narrower than said diameter of said via.

20. The integrated circuit of claim 18 further comprising a layer between said conductive plug and an inner wall of said via.

21. In a plasma processing chamber, a method for preventing damage to an underlying conductive feature while forming an overlying conductive feature out of an overlying conductive layer, said overlying conductive layer being separated from said underlying conductive feature by an insulating layer having therein a conductive plug disposed in a via, said conductive plug coupling said overlying conductive feature and said underlying conductive layer through said insulating layer, said method comprising:

etching at least partially through said overlying conductive layer using a first etch recipe to form a top portion, said top portion having a first width; and etching at least partially through a remaining thickness of said overlying conductive layer using a second etch recipe different from said first etch recipe to form a bottom portion of said overlying conductive feature, said bottom portion having a second width larger than said first width and a diameter of said via.

22. The method of claim 21 wherein said first etch recipe is configured to etch at a higher rate than said second etch recipe.

23. The method of claim 21 wherein said top portion is more anisotropic than said bottom portion.

24. The method of claim 21 further comprising etching through a barrier layer of said conductive layer using a third etch recipe different from said first etch recipe and said second etch recipe.

25. The method of claim 24 further comprising performing an overetch step after said remaining thickness of said overlying conductive layer is etched through.

* * * * *